US012627292B2

(12) United States Patent
Draxelmayr et al.

(10) Patent No.: US 12,627,292 B2
(45) Date of Patent: May 12, 2026

(54) CLAMP CIRCUITS

(71) Applicant: Infineon Technologies AG, Neubiberg (DE)

(72) Inventors: Dieter Draxelmayr, Villach (AT); Herwig Wappis, Villach (AT)

(73) Assignee: Infineon Technologies AG, Neubiberg (DE)

( * ) Notice: Subject to any disclaimer, the term of this patent is extended or adjusted under 35 U.S.C. 154(b) by 99 days.

(21) Appl. No.: 18/610,589

(22) Filed: Mar. 20, 2024

(65) Prior Publication Data

US 2024/0340001 A1      Oct. 10, 2024

(30) Foreign Application Priority Data

Apr. 5, 2023    (DE) ..................... 10 2023 108 746.0

(51) Int. Cl.
| | |
|---|---|
| *H03K 5/08* | (2006.01) |
| *H03K 17/081* | (2006.01) |
| *H03K 17/10* | (2006.01) |
| *H03K 17/30* | (2006.01) |

(52) U.S. Cl.
CPC ..... *H03K 17/302* (2013.01); *H03K 17/08104* (2013.01); *H03K 17/102* (2013.01)

(58) Field of Classification Search
CPC .......... H03K 5/08; H03K 5/082; H03K 17/30; H03K 17/302; H03K 17/102; H03K 17/08104
USPC .......................... 327/180, 309, 312, 321, 427
See application file for complete search history.

(56) References Cited

U.S. PATENT DOCUMENTS

| | | | | |
|---|---|---|---|---|
| 12,136,921 B2 * | 11/2024 | Yasusaka | .................. | G05F 1/56 |
| 2019/0115751 A1 | 4/2019 | He | | |
| 2020/0235742 A1 | 7/2020 | Whitney et al. | | |

* cited by examiner

*Primary Examiner* — Hai L Nguyen
(74) *Attorney, Agent, or Firm* — Eschweiler & Potashnik, LLC

(57) ABSTRACT

A clamp circuit including a first transistor having a control connection coupled to a first reference voltage terminal and a first controlled connection coupled to an input voltage terminal. The clamp circuit includes a second transistor having a control connection configured to receive a control voltage that is dependent on a current flowing through the first transistor, a first controlled connection coupled to the input voltage terminal, and a second controlled connection coupled to a second reference voltage terminal.

18 Claims, 4 Drawing Sheets

300

500

CLAMP CIRCUITS

REFERENCE TO RELATED APPLICATIONS

This application claims priority to German Patent Application 10 2023 108 746.0, filed on Apr. 5, 2023, the contents of which are hereby incorporated by reference in their entirety.

BACKGROUND

It is occasionally necessary for high voltages to be handled by devices that do not have an appropriate rated voltage. One example of these is overvoltage-tolerant input/output interfaces. For example, a 5 V device (i.e., a device having a 5 V power supply and 5 V input/output interfaces) may use transistors that have a lower operating voltage than 5 V, e.g. 2.5 V. One problem is how to deal with overvoltages and undervoltages beyond the 5 V power supply.

BRIEF DESCRIPTION OF THE DRAWINGS

Exemplary embodiments of the disclosure are depicted in the figures and explained in more detail below.

DETAILED DESCRIPTION

Figure 1:
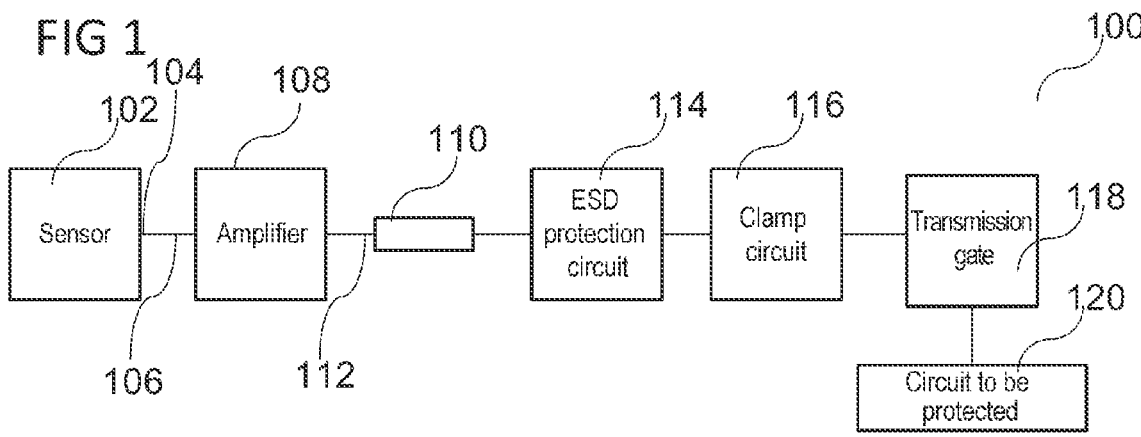
FIG. 1 shows a circuit based on various aspects of the present disclosure.

In the detailed description that follows, reference is made to the appended drawings, which form part of this description and which show specific embodiments of the disclosure for the purpose of illustration. It goes without saying that other embodiments can be used and structural or logical changes made without departing from the scope of protection of the present disclosure. It goes without saying that the features of the various illustrative embodiments described herein can be combined with one another unless specifically stated otherwise. The detailed description that follows should therefore not be regarded as restrictive, and the scope of protection of the present disclosure is defined by the attached claims.

Within the context of this description, the terms "connected" and "coupled" are used to describe both a direct and an indirect connection and a direct or indirect coupling. In the figures, identical or similar elements are provided with identical reference signs where expedient.

The disclosure relates to clamp circuits. In the case of analog inputs, the circuit is capable of processing supplied currents of +5 mA. The majority of this current flows into an electrostatic discharge (ESD) structure, for example, but with a 5.5 V power supply this would mean that the voltage at the input can be between approximately 6.5 V and −1 V when the temperature is low. This is potentially destructive for the connected circuit, for example because a gate oxide of connected transistors is designed only for ±3.6 V. Another problem that exists is an unsuitable voltage design of the transistors used in the device.

Various aspects of this disclosure provide a circuit that consumes little to no current while an input voltage is within a predefined (e.g., permitted) range. Another aspect is diversion of the excess current coming from the outside to the most suitable rail of a circuit in order to save further energy. Positive currents (that, by way of example, flow into a device, for example into a chip) are routed to a positive supply rail (coupled with a second reference voltage terminal, e.g. VDD). Negative currents are routed to a negative rail (coupled with a first reference voltage terminal, e.g. ground (GND)). Another aspect of this disclosure is the use of "low-voltage transistors" in a "high-voltage environment".

A voltage clamp circuit for discharging input currents to the supply voltage terminal VDD or ground GND using a quasi-passive circuit is provided. The voltage clamp circuit activates itself when a transistor (e.g., a metal-oxide-semiconductor (MOS) transistor) threshold voltage is exceeded.

Examples that are described here can relate to high voltages and low voltages. Some examples described here can relate to circuits for processing voltages in a range of approximately 5 V, while transistors that have a recommended operating voltage in a range of 2.5 V are used. In connection with these examples, 5 V can be understood as high voltage, while 2.5 V can be understood as low voltage. In connection with other examples described here, any desired voltage greater than a recommended operating voltage of a transistor or a usable operating voltage that is able to be used for transistors can be understood as high voltage, a voltage that is identical to or lower than the recommended operating voltage being able to be understood as low voltage.

The recommended operating voltage may be a device-dependent (for example transistor-dependent) voltage or a device-dependent (for example transistor-dependent) potential between a respective control connection, for example a piece of equipment or a base of a transistor, and a controlled connection of the transistor, for example a source or a drain, a collector or an emitter. By way of example, the recommended operating voltage may be specified in a datasheet of the transistor. The recommended operating voltage (also referred to as the rated voltage) may be a voltage that is applied to the connections of the transistor and that allows normal operation without damage to the transistor element as a result of an overvoltage being applied. Accordingly, a recommended operating voltage of a transistor (for example a gate-source voltage) VGSOP may be 2.5 volts and would be consistent with a low voltage, and a maximum usable operating voltage (which is generally greater than the associated recommended operating voltage) is meant to be 3.25 V, for example, which is consistent with a permitted range (tolerance range) of 30% of the recommended voltage range.

Transistors used in various aspects of this disclosure may be planar transistors, fin transistors or vertical transistors. The transistors may be field effect transistors (FETs) or bipolar transistors. The transistors may be metal oxide semiconductor (MOS) FETs, for example n-channel MOSFETs (also referred to as n conductivity type MOSFETs) or p-channel MOSFETs (also referred to as p conductivity type MOSFETs). The transistors may be normally off field effect transistors or normally on field effect transistors. The transistors may comprise one or more control connections (for example gate or base) and multiple controlled connections (for example source or emitter and drain or collector).

FIG. 1 shows an example of a circuit 100 based on various aspects of the present disclosure. The circuit 100 shows a possible field of use for a clamp circuit based on various aspects of the present disclosure. The clamp circuits described below can also be employed in other applications, however, in general in any desired and suitable application for a clamp circuit.

The circuit 100 comprises a DC voltage interface, for example a sensor 102 having a sensor interface 104. The sensor 102 may be connectable to a power sink (e.g., one or more processors such as one or more microcontrollers). The sensor 102 may be a Hall sensor, a knocking sensor and/or a low-frequency sensor, which uses frequencies below 1 MHz, or any other electronic sensor. The sensor interface 104 provides analog sensor signals 106 to an amplifier 108. The amplifier 108 amplifies the analog sensor signals 106 and provides amplified sensor signals 112 at its output. In some examples, an electrostatic discharge (ESD) protection circuit 114 is connected to one or more outputs of the amplifier 108. In some examples, a series resistor 110 is coupled between the amplifier 108 and the ESD protection circuit 114 for limiting a current that can flow into the ESD protection circuit 114.

Furthermore, in some examples, a clamp circuit 116 is connected between the ESD protection circuit 114 and a transmission gate 118. The output side of the transmission gate 118 is connected to a circuit 120 that is to be protected (e.g., the power sink). The clamp circuit 116 protects the circuit 120 to be protected by virtue of the clamp circuit 116 ensuring that it provides a limited voltage (e.g., the clamping voltage) to the circuit 120 to be protected. The ESD protection circuit 114 and/or the clamp circuit 116 and/or the transmission gate 118 may be integrated on a common chip or provided on individual chips.

In some examples, the circuit 100 includes multiple sensors 102, which are then connected to an input of the circuit 120 to be protected, for example by means of a multiplexer.

Figure 2:
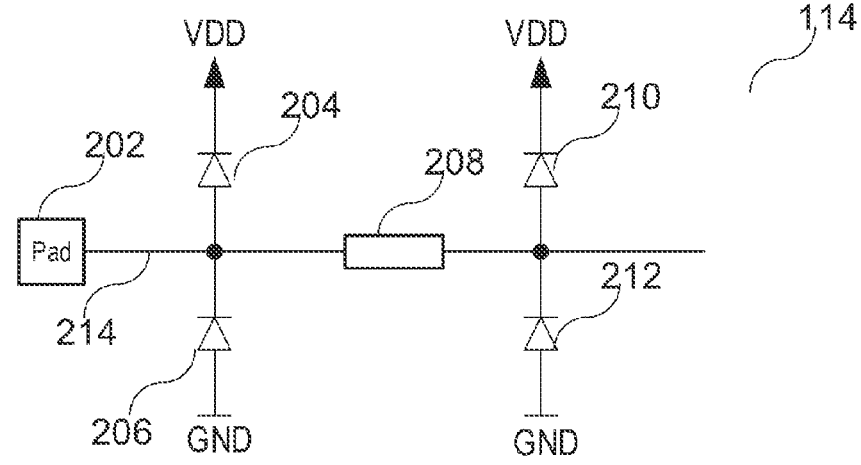
FIG. 2 shows an example of an electrostatic discharge protection circuit.

FIG. 2 shows an example of a ESD protection circuit 114.

To protect an input connection (e.g., a pad 202), the ESD protection circuit 114 comprises two primary protective diodes 204, 206, a nonreactive resistance 208 and two secondary protective diodes 210, 212. An electric current 214 supplied to the pad 202 leads to a voltage on the pad 202 that, depending on the polarity of the current 214, is a diode voltage drop higher than one reference potential VDD or a diode voltage drop lower than another reference potential GND. This wide range of variation can, as already explained above, cause damage to or even destruction of one or more of the transistors of the circuit 120 to be protected. For example, the gate oxide(s) of the transistors may be damaged if the transistors are dimensioned for a usable operating voltage that is lower than the voltage applied to the transistors.

Figure 3:
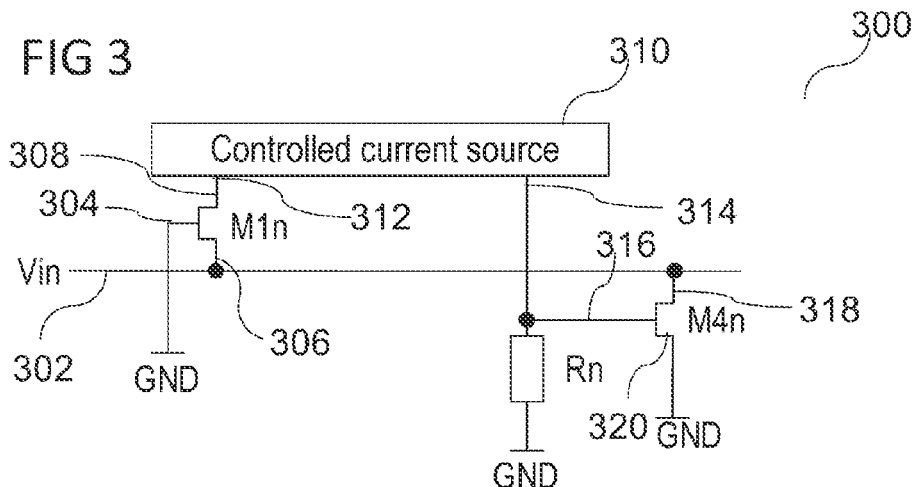
FIG. 3 shows a clamp circuit based on various aspects of the disclosure.

FIG. 3 shows an example of a first clamp circuit 300 as an example implementation of the clamp circuit 116 of FIG. 1.

The first clamp circuit 300 is used to limit a negative voltage to a value that is smaller than a diode voltage drop. If a voltage at an input 302 of the first clamp circuit 300 (also referred to as the input voltage terminal Vin) becomes negative with respect to a first reference voltage terminal (e.g., ground GND), a first transistor M1$n$ (e.g., an NMOS FET) turns on. The first transistor M1$n$ has its control connection 304 (e.g., a gate) connected to the first reference voltage terminal GND. A first controlled connection 306 (e.g., a source) of the first transistor M1$n$ is connected (e.g., directly) to the input 302 and hence to the input voltage terminal Vin. A second controlled connection 308 (e.g., a drain) of the first transistor M1$n$ is connected (e.g., directly) to an input 312 of a controlled current source 310.

When the first transistor M1$n$ turns on, this leads to a current provided at an output 314 of the controlled current source 310. This in turn leads to a voltage drop across a resistance Rn (e.g., a nonreactive resistance) that will switch on a second transistor M4$n$ (e.g., an NMOS-FET), as a result of which the second transistor M4$n$ turns on. The resistance Rn may be connected (e.g., directly) between the output 314 of the controlled current source 310 and the first reference voltage terminal GND. A control connection 316 of the second transistor M4$n$ is likewise connected (e.g., directly) to the output 314 of the controlled current source 310 and to a first connection of the resistance Rn. In some examples, a second connection of the resistance Rn is connected (e.g., directly) to the first reference voltage terminal (e.g., ground GND). A first controlled connection 318 of the second transistor M4$n$ is connected (e.g., directly) to the input voltage terminal Vin and also to the first controlled connection 306 of the first transistor M1$n$. A second controlled connection 320 of the second transistor M4$n$ is connected (e.g., directly) to a second reference voltage terminal (e.g., ground GND).

When the second transistor M4$n$ is turned on, a low-impedance connection is made between the input 302 of the clamp circuit 300 and the second reference voltage terminal (e.g., ground GND) that can discharge the current to the second reference voltage terminal GND. Depending on the dimensioning of the transistors (e.g., the first transistor M1$n$ and the second transistor M4$n$) and the resistance Rn, the "aggressiveness" of the clamp circuit 300 can be adjusted. In some examples, a capacitor is connected between the input voltage terminal Vin and the first reference voltage terminal GND (e.g., as shown in FIG. 4) to improve stability.

The individual transistors in FIG. 3 can also be replaced with a respective transistor of the opposite conductivity type (for example NMOSFETs by PMOSFETs and PMOSFETs by NMOSFETs). The applicable reference voltage terminals then can also be adapted accordingly (ground GND by VDD, for example, and VDD by ground GND, for example). Such an "inverse" first clamp circuit then protects in the accordingly other voltage direction.

These two first clamp circuits (i.e. the first clamp circuit 300 and the accordingly designed clamp circuit containing transistors of the opposite conductivity type) may also be combined with one another, i.e. connected in parallel with one another, in order to afford protection in both "directions", that is to say both against an overvoltage with respect to VDD and against an undervoltage with respect to GND.

Figures 4, 5:
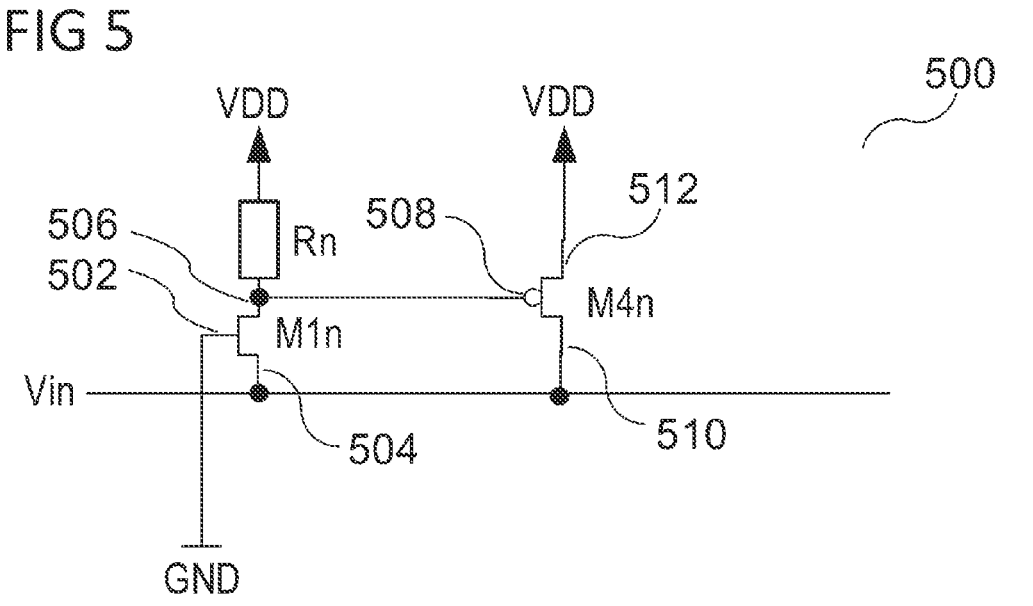
FIG. 4 shows an example of the clamp circuit from FIG. 3 including an example implementation of the controlled current source.
FIG. 5 shows another clamp circuit based on various aspects of the disclosure.

FIG. 4 shows the first clamp circuit 300 from FIG. 3, wherein one example implementation of the controlled current source 310 is depicted in more detail. In this example, the controlled current source 310 comprises a current mirror 310 formed by a first current mirror transistor M2$n$ and a second current mirror transistor M3$n$. A control connection 402 of the first current mirror transistor M2$n$ is connected (e.g., directly) to a control connection 408 of the second current mirror transistor M3$n$. A first controlled connection 404 (e.g., a drain) of the first current mirror transistor M2$n$ is connected (e.g., directly) to the second controlled connection 308 of the first transistor M1$n$. A second controlled connection 406 (e.g., a source) of the first current mirror transistor M2n is connected (e.g., directly) to a third reference voltage terminal (e.g., supply voltage terminal VDD).

A first controlled connection 410 (e.g., a drain) of the second current mirror transistor M3n is connected (e.g., directly) to the first connection of the resistance Rn and to the control connection 316 of the second transistor M4n. A second controlled connection 412 (e.g., a source) of the second current mirror transistor M4n is connected (e.g., directly) to the third reference voltage terminal (e.g., supply voltage terminal VDD). In some examples, a capacitor 414 is connected between the input voltage terminal Vin and the first reference voltage terminal GND. The capacitor 414 may provide better stability for the first clamp circuit 300. In some examples, an additional capacitor 416 is connected in parallel with the resistance Rn. The additional capacitor 416 may further increase the stability of the first clamp circuit 300.

The current mirror 310 may have any desired scaling, for example a scaling of 1:1, 1:n, where n is less than 1, for example greater than or equal to 0.1, or 1:m, where m is greater than 1, for example less than or equal to 10.

When the first transistor M1n turns on, the current flowing through the first transistor M1n and thus also through the first current mirror transistor M2n is mirrored and brings about a flow of current through the second current mirror transistor M3n. This flow of current then brings about a voltage drop across the resistance Rn. The voltage drop controls the second transistor M4n.

FIG. 5 shows an example of a second clamp circuit 500 based on various aspects of the disclosure, which is based on similar operating principle as the clamp circuit 300.

The second clamp circuit 500 likewise comprises a first transistor M1n and a second transistor M4n, which are of different conductivity types in this example, however. For example, the first transistor M1n is an n-conductive transistor (e.g., an NMOS FET) and the second transistor M4n is a p-conductive transistor (e.g., a PMOS FET). Alternatively, in some other examples, the first transistor M1n is a p-conductive transistor (e.g., a PMOS FET) and the second transistor M4n is an n-conductive transistor (e.g., a NMOS FET). In such examples, the reference voltage terminals are swapped accordingly compared with the example depicted in FIG. 5.

A control connection 502 of the first transistor M1n is connected (e.g., directly) to a first reference voltage terminal (e.g., ground GND). A first controlled connection 504 of the first transistor M1n is connected (e.g., directly) to the input voltage terminal Vin. A second controlled connection 506 of the first transistor M1n is connected (e.g., directly) to a second reference voltage terminal (e.g., supply voltage terminal VDD), which in this example is different than the first reference voltage terminal (e.g., ground GND).

A (nonreactive) resistance Rn is connected between the second controlled connection 506 of the first transistor M1n and a third reference voltage terminal (e.g., the supply voltage terminal VDD).

A control connection 508 of the second transistor M4n is connected (e.g., directly) to the second controlled connection 506 of the first transistor M1n, with the result that a voltage drop across the resistance Rn controls the second transistor M4n. A first controlled connection 510 of the second transistor M4n is connected (e.g., directly) to the input voltage terminal Vin. A second controlled connection 512 of the second transistor M4n is connected (e.g., directly) to the third reference voltage terminal (e.g. the supply voltage terminal VDD).

In this example, the voltage at the first reference voltage terminal and voltage at the second reference voltage terminal are different than one another. In the example shown in FIG. 5, the voltage at the first reference voltage terminal is smaller than the voltage at the second reference voltage terminal. In examples where the second clamp circuit 500 includes respectively "inverse" transistors, the voltage at the first reference voltage terminal, which controls the first transistor M1n (in the "inverse" case a PMOS FET), is greater than the voltage at the second reference voltage terminal, to which the "overcurrent" drains through the second transistor Mn4 (in the "inverse" case an NMOS FET).

If the voltage at the input voltage terminal Vin becomes smaller than the voltage at the first reference voltage terminal (and thus for example less than 0 V, which is to be avoided), specifically such that the voltage difference between the voltage on the control connection 502 of the first transistor M1n and the voltage on the first controlled connection 504 of the first transistor M1n is smaller than at least the threshold voltage of the first transistor M1n, the first transistor M1n turns on (i.e. becomes low-impedance) and the voltage on the second controlled connection 506 of the first transistor M1n is reduced. The reduced voltage then controls the second transistor M4n in such a way that it too turns on (in this example where the second transistor M4n is a PMOS FET). This allows a possible "overcurrent" to drain to the third reference voltage terminal.

So long as the voltage at the input voltage terminal Vin remains great enough (e.g., the voltage difference between the voltage on the control connection 502 of the first transistor M1n and the first controlled connection 504 of the first transistor M1n is smaller than the threshold voltage of the first transistor M1n), the first transistor M1n remains off (i.e. at high impedance). In some examples, this provides passive monitoring of the voltage at the input voltage terminal Vin with little or no current consumption.

Depending on the dimensioning of the transistors M1n, M4n and the resistance Rn, the "aggressiveness" of the second clamp circuit 500 can be adjusted. In some examples, an additional capacitor (as shown in FIG. 4, for example) is coupled in parallel with the resistance Rn to improve stability.

By applying a somewhat higher auxiliary voltage than the ground potential GND (e.g., up to 0.5 V, for example up to 0.25 V) to the control connection 304, 502 (e.g. to the gate connection) of the first transistor M1n, the residual clamping voltage can be reduced further.

For the clamp circuits 300, 500 depicted in FIG. 3, FIG. 4 and FIG. 5, the implementation thereof may entail a high supply voltage being present and low-voltage transistors being available. In other words, the use of unipolar (PMOS or NMOS) transistors with lower voltage robustness than the analog input voltage may be an aspect of the examples described here for forming a clamp circuit.

In some examples, it is assumed that the supply voltage may be up to 5.5 V and the transistors of the clamp circuit 300, 500 are nominally designed for 2.5 V (3.6 V as an absolute maximum) (i.e., the recommended operating voltage of the transistors in some examples is 2.5 V and the usable operating voltage of the transistors in some examples is 3.6 V).

In some examples, in order to avoid damage for example to the gate oxide of the transistors M1n, M4n, the circuit includes additional protective mechanisms, which are explained in more detail below.

Figure 6:
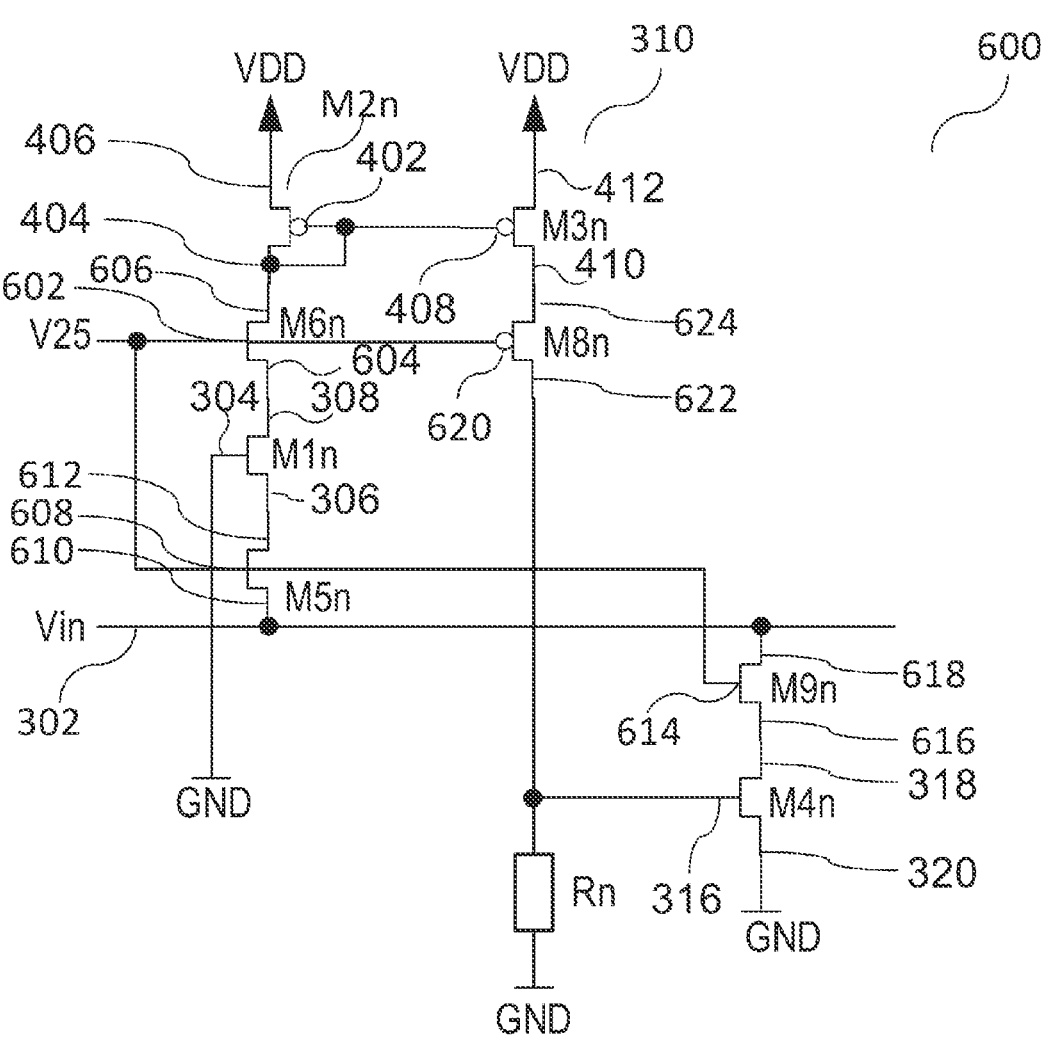
FIG. 6 shows another clamp circuit based on various aspects of the disclosure.

FIG. 6 shows an example of a clamp circuit 600. The clamp circuit 600 is structurally similar to the first clamp circuit 300 from FIG. 3 and FIG. 4, but also includes additional protection circuits (e.g., additional protective transistors).

A first protective transistor M5$n$ (e.g., a first NMOS FET), and a second protective transistor M6$n$ (e.g., a second FET), are used to protect the first transistor M1$n$. Transistors M5$n$, Mon limit the maximum voltage on the first controlled connection 306 (e.g. source) of the first transistor M1$n$ and on the second controlled connection 308 (e.g. drain) of the first transistor M1$n$ to such low values that the gate oxide does not suffer from reliability problems.

V25 in this example denotes a voltage that is sufficiently smaller than the supply voltage VDD to prevent damage to the first transistor M1$n$, for example the voltage V25 is approximately half of the supply voltage VDD. If for example the supply voltage were 5.5 V, the voltage V25 would be 2.75 V. This numerical example also shows the advantageous effect of such a clamp circuit: if the voltage at the input voltage terminal Vin were able to vary between −1 V and +6.5 V, it would be impossible to find a statically safe control voltage (e.g. gate voltage) for a transistor (e.g. the first transistor M1$n$) connected to the input node.

Additionally, an active circuit for controlling the gate voltage on the first transistor M1$n$ and on the second transistor M4$n$ is avoided. This avoids an additional current consumption.

The same also applies to a third protective transistor M9$n$ (e.g., a third NMOS FET). The third protective transistor M9$n$ allows the voltage at the input voltage terminal Vin to become high without damaging or even destroying the second transistor M4$n$.

Furthermore, in some examples, the circuit includes a fourth protective transistor M8$n$ (e.g., a fourth (PMOS) FET). The fourth protective transistor M8$n$ performs a similar task for protecting the second current mirror transistor M3$n$.

The first protective transistor Mon is connected in series with the first transistor M1$n$ between the second controlled connection 308 of the first transistor M1$n$ (e.g., a first controlled connection 604 of the first protective transistor M6$n$ is coupled to the second controlled connection 308 of the first transistor M1$n$) and a third reference voltage terminal (e.g., VDD) or a connection of the current-controlled current source 310 (e.g., a second controlled connection 606 of the first protective transistor M6$n$ is coupled to the first controlled connection 404 of the first current mirror transistor M2$n$). A control connection 602 of the first protective transistor Mon is configured to receive a voltage, for example the voltage V25. A difference voltage between the received voltage (e.g. V25) and the voltage at the first reference voltage terminal (e.g., GND) is smaller than a predefined maximum voltage (e.g., smaller than a usable operating voltage of the first transistor M1$n$). In other words, the voltage V25 is applied to the control connection 602 of the first protective transistor M6$n$. As a result, the first protective transistor Mon is used as a voltage limiter that prevents voltages (e.g., voltages on the gate oxide of the first transistor M1$n$) from becoming too great. The first protective transistor Mon ensures that the second controlled connection 308 (e.g., drain) of the first transistor M1$n$ has a voltage applied to it that is such that the absolute value of the gate-drain voltage on the first transistor M1$n$ is low enough for the first transistor M1$n$ (e.g., the gate oxide thereof) not to be damaged. In some examples, this is achieved by virtue of the first protective transistor Mon turning off when the voltage on the second controlled connection 308 (e.g., drain) of the first transistor M1$n$ becomes too great.

The second protective transistor M5$n$ is likewise connected in series with the first transistor M1$n$, but between the first controlled connection 306 of the first transistor M1$n$ and the input voltage terminal Vin. A control connection 608 of the second protective transistor M5$n$ is configured to receive a voltage, for example the voltage V25. A difference voltage between the received voltage (e.g. V25) and the voltage at the first reference voltage terminal (for example GND) is smaller than the predefined maximum voltage (e.g., smaller than the usable operating voltage of the first transistor M1$n$). In other words, the voltage V25 is applied to the control connection 608 of the second protective transistor M5$n$. As a result, the second protective transistor M5$n$ is likewise used as a voltage limiter that prevents voltages (e.g., voltages on the gate oxide of the first transistor M1$n$) from becoming too great. The second protective transistor M5$n$ ensures that the first controlled connection 306 (e.g., source) of the first transistor M1$n$ has a voltage applied to it that is such that the absolute value of the gate-source voltage on the first transistor M1$n$ is low enough for the first transistor M1$n$ (e.g., the gate oxide thereof) not to be damaged. In some examples, this is achieved by virtue of the second protective transistor M5$n$ turning off when the voltage at the input voltage terminal Vin becomes too high and thus for example the gate-source voltage on the second protective transistor M5$n$ becomes too small. A first controlled connection 610 of the second protective transistor M5$n$ is connected to the input voltage terminal Vin. A second controlled connection 612 of the second protective transistor M5$n$ is connected to the first controlled connection 306 of the first transistor M1$n$.

The third protective transistor M9$n$ is connected in series with the second transistor M4$n$ between the first controlled connection 318 of the second transistor M4$n$ and the input voltage terminal Vin. A control connection 614 of the third protective transistor M9$n$ is configured to receive a voltage, for example the voltage V25. A difference voltage between a voltage on the control connection 316 of the second transistor M4$n$ and the received voltage (e.g. V25) is smaller than the predefined maximum voltage (e.g., the usable operating voltage of the second transistor M4$n$). A first controlled connection 616 of the third protective transistor M9$n$ is connected to the first controlled connection 318 of the second transistor M4$n$. A second controlled connection 618 of the third protective transistor M9$n$ is connected to the input voltage terminal Vin. In other words, the voltage V25 is applied to the control connection 614 of the third protective transistor M9$n$. As a result, the third protective transistor M9$n$ is used as a voltage limiter that prevents voltages (e.g., voltages on the gate oxide of the second transistor M4), from becoming too great. The third protective transistor M9$n$ ensures that the first controlled connection 318 (e.g., drain) of the second transistor M4$n$ has a voltage applied to it that is such that the absolute value of the gate-drain voltage on the second transistor M1$n$ is low enough for the second transistor M4$n$ (e.g., the gate oxide thereof) not to be damaged.

The fourth protective transistor M8$n$ is connected between a fourth reference voltage terminal (e.g. GND) and the third reference voltage terminal (e.g. VDD). A control connection 620 of the fourth protective transistor M8$n$ is configured to receive a voltage, for example the voltage V25. A difference voltage between a voltage on the control connection 408 of the second current mirror transistor M3$n$ and the received voltage (e.g. V25) is smaller than the predefined maximum voltage (e.g. the usable operating voltage of the second current mirror transistor M3$n$). The fourth protective transistor M8$n$ is of a different conductivity type than the first transistor M1$n$ and the second transistor M4$n$. A first controlled connection 622 of the fourth protective transistor M8$n$ is connected to the fourth reference voltage terminal (e.g. GND) by means of the resistance Rn. A second controlled connection 624 of the fourth protective transistor M8$n$ is connected to the first controlled connection 410 of the second current mirror transistor M3$n$.

It should be noted that each protection circuit or protective transistor may be provided individually without the others or in any desired combination with the others, depending on which transistors are meant to be protected in each case.

In some examples, the clamp circuit 600 has additional protective mechanisms, as described in more detail below.

Figure 7:
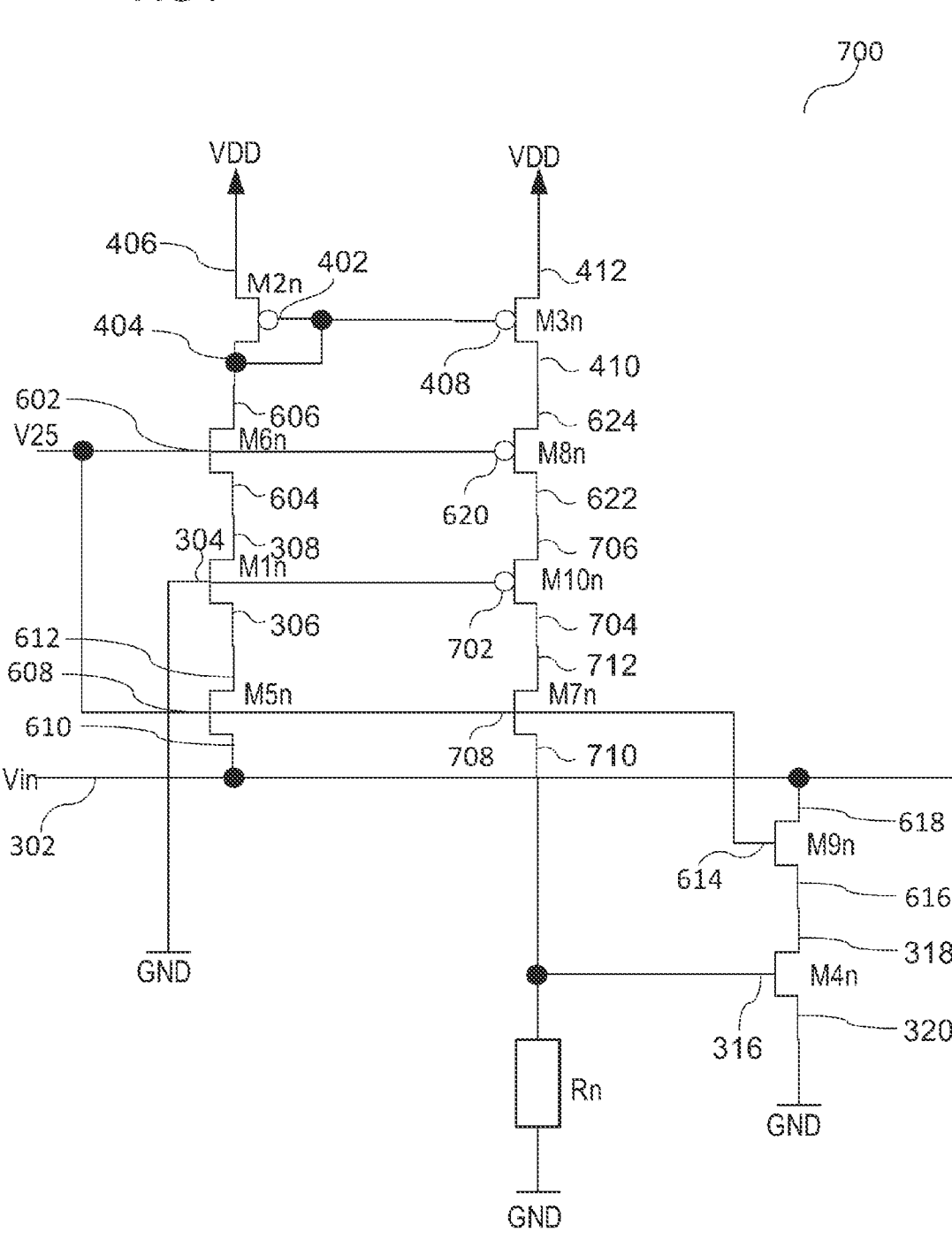
FIG. 7 shows another clamp circuit based on various aspects of the disclosure.

FIG. 7 shows an example of another clamp circuit 700.

The clamp circuit 700 may additionally comprise a fifth protective transistor M10$n$ and a sixth protective transistor M7$n$. As an illustration, these are used as protection against stress due to hot charge carriers and as additional gate protection for the second transistor M4$n$.

The fifth protective transistor M10$n$ is connected between the fourth protection circuit M8$n$ and the fourth reference voltage terminal (e.g. GND). The fifth protective transistor M10$n$ is of a different conductivity type than the first transistor M1$n$ (in the present example the fifth protective transistor M10$n$ is a PMOS FET). A control connection 702 of the fifth protective transistor M10$n$ is connected to the first reference voltage terminal, for example to GND. A first controlled connection 704 of the fifth protective transistor M10$n$ is connected to the resistance Rn, for example by means of the sixth protective transistor M7$n$, if provided. In some examples including the sixth protective transistor M7$n$, the first controlled connection 704 of the fifth protective transistor M10$n$ is directly connected to a second controlled connection 712 of the sixth protective transistor M7$n$. A second controlled connection 706 of the fifth protective transistor M10$n$ is directly connected to the first controlled connection 622 of the fourth protective transistor M8$n$.

The sixth protective transistor M7$n$, if provided, is connected between the fourth protection circuit M8$n$ and the fourth reference voltage terminal (e.g., GND). A control connection 708 of the sixth protective transistor M7$n$ is configured to receive a voltage (e.g. V25). A difference voltage between a voltage on the control connection 408 of the second current mirror transistor M3$n$ and the received voltage V25 is smaller than the predefined maximum voltage. A first controlled connection 710 is connected directly to the resistance Rn and a second controlled connection 712 is connected directly to the first controlled connection 704 of the fifth protective transistor M10$n$ (if provided).

FIG. 6 and FIG. 7 show some protective measures against negative voltages. The same can also happen for a positive reference potential, for example a positive supply voltage VDD, when a positive current is supplied. As a countermeasure, the whole circuit (that is to say some clamp circuit, as depicted in FIG. 3, FIG. 4, FIG. 5, FIG. 6, FIG. 7) can be flipped. Transistors that are connected to the ground terminal GND as the reference potential, for example, should then be connected to the supply voltage terminal VDD as the reference potential, for example, and vice versa. NMOS transistors should also be replaced by PMOS transistors and vice versa. This allows complete, essentially symmetrical protection to be attained.

These respective clamp circuits (i.e. the respective clamp circuit depicted and an accordingly designed clamp circuit containing transistors of the opposite conductivity type) may also be combined with one another, i.e. connected in parallel with one another, in order to afford protection in both "directions", that is to say both against an overvoltage with respect to VDD and against an undervoltage with respect to GND.

If one or more of the transistors is or are a laterally diffused metal oxide semiconductor (LDMOS) transistor, the clamp circuit 600 shown in FIG. 6 or the clamp circuit 700 shown in FIG. 7 could be simplified. A certain level of protection for the first transistor M1$n$ could still be useful, because the gate-source voltage on the first transistor M1$n$ could still be susceptible to gate-oxide breaches. Transistors for protecting the drain side of the first transistor M1$n$ are possibly no longer necessary, however, for example the third protective transistor M9$n$, the fourth protection M8$n$ or the fifth protective transistor M10$n$. In some examples, if the first transistor M1$n$ is replaced by a series connection formed by LDMOS transistors connected from source to source, the second protective transistor M5$n$ and the first protective transistor M6$n$ could also be dispensed with.

Various aspects of the disclosure are explained below:

Example 1 is a clamp circuit.

The clamp circuit comprises a first transistor, the control connection of which is connected to a first reference voltage terminal, and the first controlled connection of which is connected to the input voltage terminal. The clamp circuit further comprises a second transistor, the control connection of which is configured to receive a control voltage that is dependent on a current flowing through the first transistor, the first controlled connection of which is connected to the input voltage terminal, and the second controlled connection of which is connected to a second reference voltage terminal.

In example 2, the subject matter of example 1 may optionally comprise the voltage at the first reference voltage terminal and the voltage at the second reference voltage terminal being identical.

In example 3, the subject matter of either of examples 1 and 2 may optionally comprise the first transistor and the second transistor being of identical conductivity type.

In example 4, the subject matter of example 1 may optionally comprise the voltage at the first reference voltage terminal being smaller than the voltage at the second reference voltage terminal.

In example 5, the subject matter of either of examples 1 and 4 may optionally comprise the first transistor being a transistor of an n conductivity type and the second transistor being of a p conductivity type.

In example 6, the subject matter of example 1 may optionally comprise the voltage at the first reference voltage terminal being greater than the voltage at the second reference voltage terminal.

In example 7, the subject matter of either of examples 1 and 6 may optionally comprise the first transistor being a transistor of a p conductivity type and the second transistor being of an n conductivity type.

In example 8, the subject matter of any of examples 1 to 7 may optionally further comprise a controlled current source, the control signal of which is the current flowing through the first transistor, wherein the control voltage is dependent on the controlled current of the controlled current source.

In example 9, the subject matter of example 8 may optionally comprise the controlled current source comprising a current mirror or being formed by a current mirror.

In example 10, the subject matter of any of examples 1 to 9 may optionally further comprise an electrical resistance for providing the control voltage.

In example 11, the subject matter of any of examples 1 to 10 may optionally further comprise a first protection circuit connected in series with the first transistor between the second controlled connection of the first transistor and a third reference voltage terminal, the first protection circuit being such that a voltage difference between the control connection of the first transistor and the second controlled connection of the first transistor is smaller than a predefined maximum voltage.

In example 12, the subject matter of example 11 may optionally comprise the first protection circuit comprising a first protective transistor connected in series with the first transistor between the second controlled connection of the first transistor and the third reference voltage terminal, and a control connection of the first protective transistor being configured to receive a voltage, a difference voltage between the received voltage and the voltage at the first reference voltage terminal being smaller than the predefined maximum voltage.

In example 13, the subject matter of any of examples 1 to 12 may optionally further comprise a second protection circuit connected in series with the first transistor between the first controlled connection of the first transistor and the input voltage terminal, the second protection circuit being such that a voltage difference between the control connection of the first transistor and the first controlled connection of the first transistor is smaller than a predefined maximum voltage.

In example 14, the subject matter of example 13 may optionally comprise the second protection circuit comprising a second protective transistor connected in series with the first transistor between the first controlled connection of the first transistor and the input voltage terminal, and a control connection of the second protective transistor being configured to receive a voltage, a difference voltage between the received voltage and the voltage at the first reference voltage terminal being smaller than the predefined maximum voltage.

In example 15, the subject matter of any of examples 1 to 14 may optionally further comprise a third protection circuit connected in series with the second transistor between the first controlled connection of the second transistor and the input voltage terminal, the third protection circuit being such that a voltage difference between the control connection of the second transistor and the first controlled connection of the second transistor is smaller than a predefined maximum voltage.

In example 16, the subject matter of claim 15 may optionally comprise the third protection circuit comprising a third protective transistor connected in series with the second transistor between the first controlled connection of the second transistor and the input voltage terminal, and a control connection of the third protective transistor being configured to receive a voltage, a difference voltage between a voltage on the control connection of the second transistor and the received voltage being smaller than the predefined maximum voltage.

In example 17, the subject matter of any of examples 1 to 16 may optionally further comprise a transistor connected between a fourth protection circuit and the third reference voltage terminal, and the fourth protection circuit, connected in series with the transistor between a first controlled connection of the transistor and a fourth reference voltage terminal, the fourth protection circuit being such that a voltage difference between the control connection of the transistor and the first controlled connection of the transistor is smaller than a predefined maximum voltage.

In example 18, the subject matter of example 17 may optionally comprise the fourth protection circuit comprising a fourth protective transistor connected between the fourth reference voltage terminal and the third reference voltage terminal, the fourth protective transistor being of a different conductivity type than the first transistor, and a control connection of the fourth protective transistor being configured to receive a voltage, a difference voltage between a voltage on the control connection of the transistor and the received voltage being smaller than the predefined maximum voltage.

In example 19, the subject matter of either of examples 17 and 18 may optionally further comprise a fifth protective transistor connected between the fourth protection circuit and a fourth reference voltage terminal, the fifth protective transistor being of a different conductivity type than the first transistor, and a control connection of the fifth protective transistor being connected to the first reference voltage terminal.

In example 20, the subject matter of any of examples 17 to 19 may optionally further comprise a sixth protective transistor connected between the fourth protection circuit and the fourth reference voltage terminal, a control connection of the sixth protective transistor being configured to receive a voltage, a difference voltage between a voltage on the control connection of the transistor and the received voltage being smaller than the predefined maximum voltage.

In example 21, the subject matter of any of examples 11 to 20 may optionally comprise the predefined maximum voltage being identical to or smaller than a usable operating voltage of the first transistor and/or than a usable operating voltage of the second transistor.

In example 22, the subject matter of example 21 may optionally comprise the predefined maximum voltage being in a range from 1.5 V to 4 V, for example being approximately 3.6 V.

In example 23, the subject matter of any of examples 1 to 22 may optionally comprise the first transistor and/or the second transistor being a laterally diffused metal oxide semiconductor (LDMOS) transistor.

In example 24, the subject matter of any of examples 1 to 23 may optionally comprise a voltage difference between a voltage at the input voltage terminal and the voltage at the first reference voltage terminal being greater than a usable operating voltage of the first transistor and/or than a usable operating voltage of the second transistor.

In example 25, the subject matter of example 24 may optionally comprise the voltage difference between the voltage at the input voltage terminal and the voltage at the first reference voltage terminal being in a range from −1 V to 7 V, for example in a range from −0.5 V to 6 V.

Example 26 is a circuit. The circuit may comprise a logic circuit having an input connection, and a clamp circuit according to one of examples 1 to 25 connected to the input connection.

In example 27, the subject matter of example 26 may optionally comprise the logic circuit being a microcontroller.

In example 28, the subject matter of either of examples 26 and 27 may optionally further comprise an electrostatic discharge protection circuit, the clamp circuit being connected between the electrostatic discharge protection circuit and the logic circuit.

In example 29, the subject matter of any of examples 26 to 28 may optionally further comprise a sensor circuit containing at least one sensor, the clamp circuit being connected between the sensor circuit and the logic circuit.

Although specific exemplary embodiments have been described in the disclosure, it should be understood by those persons who are familiar with the technical field that diverse modifications of the configuration and details thereof can be implemented without departing from the essence and scope of the disclosure as defined by the claims that follow. The scope of the disclosure is therefore determined by the appended claims, and the intention is for all changes that lie within the scope of the meaning and the range of equivalence of the claims to be encompassed by the claims.

What is claimed is:

1. A clamp circuit comprising:
a controlled current source having a first connection and a second connection;
a first transistor having a control connection coupled to a first reference voltage terminal and having a first controlled connection and a second controlled connection coupled in series between an input voltage terminal and the first connection of the controlled current source, wherein the controlled current source is configured to generate a mirror current at the second connection of the controlled current source based on a current flowing through the first transistor; and
a second transistor having a control connection coupled to the second connection of the controlled current source and configured to receive a control voltage that is dependent on the mirror current, having a first controlled connection coupled to the input voltage terminal, and having a second controlled connection coupled to a second reference voltage terminal.

2. The clamp circuit of claim 1, wherein a voltage at the first reference voltage terminal is approximately equal to a voltage at the second reference voltage terminal.

3. The clamp circuit of claim 2, wherein the first transistor and the second transistor are of identical conductivity type.

4. The clamp circuit of claim 1, further comprising:
a resistor coupling the control connection of the second transistor and the second connection of the controlled current source to a third reference voltage terminal, the resistor configured to provide the control voltage at the control connection of the second transistor.

5. The clamp circuit of claim 4, wherein the controlled current source comprises a fourth reference voltage terminal, the clamp circuit further comprising:
a first protection circuit coupled in series with the first transistor between the second controlled connection of the first transistor and the fourth reference voltage terminal, wherein a difference between a voltage at the control connection of the first transistor and a voltage at the second controlled connection of the first transistor is smaller than a predefined maximum voltage.

6. The clamp circuit of claim 5, wherein the controlled current source comprises a fifth reference voltage terminal, wherein the first protection circuit comprises a first protective transistor coupled in series with the first transistor between the second controlled connection of the first transistor and the fourth reference voltage terminal, the first protective transistor having a control connection coupled to the fifth reference voltage terminal and configured to receive a supply voltage, wherein a difference between the supply voltage and a voltage at the first reference voltage terminal is smaller than the predefined maximum voltage.

7. The clamp circuit of claim 6, further comprising:
a second protection circuit coupled in series with the first transistor between the first controlled connection of the first transistor and the input voltage terminal, wherein a difference between the voltage at the control connection of the first transistor and a voltage at the first controlled connection of the first transistor is smaller than the predefined maximum voltage.

8. The clamp circuit of claim 7,
wherein the second protection circuit comprises a second protective transistor coupled in series with the first transistor between the first controlled connection of the first transistor and the input voltage terminal, the second protective transistor having a control connection coupled to the fifth reference voltage terminal and configured to receive the supply voltage.

9. The clamp circuit of claim 8, further comprising:
a third protection circuit coupled in series with the second transistor between the first controlled connection of the second transistor and the input voltage terminal, wherein a difference between a voltage at the control connection of the second transistor and a voltage at the first controlled connection of the second transistor is smaller than the predefined maximum voltage.

10. The clamp circuit of claim 9,
wherein the third protection circuit comprises a third protective transistor coupled in series with the second transistor between the first controlled connection of the second transistor and the input voltage terminal, the third protective transistor having a control connection coupled to the fifth reference voltage terminal and configured to receive the supply voltage, wherein a difference between the voltage at the control connection of the second transistor and the supply voltage is smaller than the predefined maximum voltage.

11. The clamp circuit of claim 10, further comprising:
a first current mirror transistor having a first controlled connection coupled to the fourth reference voltage terminal, having a second controlled connection coupled to the second controlled connection of the first transistor, and having a control connection coupled to the second controlled connection of the first current mirror transistor; and
a second current mirror transistor coupled between a fourth protection circuit and the fourth reference voltage terminal and having a control connection coupled to the control connection of the first current mirror transistor, the fourth protection circuit coupled in series with the second current mirror transistor between a first controlled connection of the second current mirror transistor and the third reference voltage terminal, wherein a difference between a voltage at the control connection of the second current mirror transistor and a voltage at the first controlled connection of the second current mirror transistor is smaller than the predefined maximum voltage.

12. The clamp circuit of claim 11,
wherein the fourth protection circuit comprises a fourth protective transistor coupled between the fourth reference voltage terminal and the third reference voltage terminal, the fourth protective transistor being of a different conductivity type than the first transistor, the fourth protective transistor having a control connection configured to receive the supply voltage, wherein a difference between the voltage at the control connection of the second current mirror transistor and the supply voltage is smaller than the predefined maximum voltage.

13. The clamp circuit of claim 12, further comprising:
a fifth protective transistor coupled between the fourth protective transistor and the third reference voltage terminal, the fifth protective transistor being of a different conductivity type than the first transistor, the fifth protective transistor having a control connection coupled to the first reference voltage terminal.

14. The clamp circuit of claim 13, further comprising:
a sixth protective transistor coupled between the fourth protective transistor and the third reference voltage terminal, the sixth protective transistor having a control connection configured to receive the supply voltage.

15. The clamp circuit of claim 14,
wherein the predefined maximum voltage is less than or approximately equal to a usable operating voltage of the first transistor and/or a usable operating voltage of the second transistor,
wherein a difference between a voltage at the input voltage terminal and the voltage at the first reference voltage terminal is greater than the usable operating voltage of the first transistor and/or the usable operating voltage of the second transistor.

16. A clamp circuit comprising:
a current mirror circuit comprising a first transistor and a second transistor, the first transistor having a first current terminal coupled to a first reference voltage terminal, the second transistor having a first current terminal coupled to the first reference voltage terminal, the first transistor having a control terminal coupled to a control terminal of the second transistor and a second current terminal of the first transistor;
a resistor having a first terminal coupled to a second current terminal of the second transistor and having a second terminal coupled to a second reference voltage terminal;

a third transistor having a control terminal coupled to the second reference voltage terminal, having a first current terminal coupled to the second current terminal of the first transistor, and having a second current terminal coupled to an input voltage terminal; and
a fourth transistor having a control terminal coupled to the first terminal of the resistor and the second current terminal of the second transistor, having a first current terminal coupled to the input voltage terminal, and having a second current terminal coupled to the second reference voltage terminal.

17. The clamp circuit of claim 16, further comprising:
a sixth transistor having a control terminal coupled to a third reference voltage terminal, and having a first current terminal and a second current terminal coupled in series between the second current terminal of the third transistor and the input voltage terminal; and
a seventh transistor having a control terminal coupled to the third reference voltage terminal, and having a first current terminal and a second current terminal coupled in series between the first current terminal of the fourth transistor and the input voltage terminal.

18. The clamp circuit of claim 16, further comprising:
a sixth transistor having a control terminal coupled to a third reference voltage terminal, and having a first current terminal and a second current terminal coupled in series between the second current terminal of the first transistor and the first current terminal of the third transistor; and
a seventh transistor having a control terminal coupled to the third reference voltage terminal, having a first current terminal coupled to the second current terminal of the second transistor, and having a second current terminal coupled to the first terminal of the resistor and the control terminal of the fourth transistor.

* * * * *